(12) United States Patent
Hamanaka et al.

(10) Patent No.: US 6,821,687 B2
(45) Date of Patent: Nov. 23, 2004

(54) PHOTO MASK FOR FABRICATING SEMICONDUCTOR DEVICE HAVING DUAL DAMASCENE STRUCTURE

(75) Inventors: Nobuaki Hamanaka, Tokyo (JP); Takashi Yokoyama, Tokyo (JP); Kazutoshi Shiba, Tokyo (JP); Noriaki Oda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 246 days.

(21) Appl. No.: 10/112,716

(22) Filed: Apr. 2, 2002

(65) Prior Publication Data
US 2002/0142235 A1 Oct. 3, 2002

(30) Foreign Application Priority Data
Apr. 2, 2001 (JP) ........................................ 2001-103987

(51) Int. Cl.[7] .................................................. G03F 9/00
(52) U.S. Cl. ............................. 430/5; 430/22; 430/311; 430/312; 430/313; 430/322
(58) Field of Search ....................... 430/5, 22, 311–313, 430/322

(56) References Cited

U.S. PATENT DOCUMENTS 5,935,762 A * 8/1999 Dai et al. .................. 430/312
6,514,671 B1 * 2/2003 Parikh et al. ............... 430/313

FOREIGN PATENT DOCUMENTS

| JP | 61-125132 | 12/1986 |
|---|---|---|
| JP | 09-074063 | 3/1997 |
| JP | 2000-150641 | 5/2000 |

* cited by examiner

Primary Examiner—Geraldine Letscher
(74) Attorney, Agent, or Firm—Young & Thompson

(57) ABSTRACT

A photo mask for fabricating a semiconductor device having a dual damascene structure which has a via coupled with a lower wiring layer and has an upper wiring layer coupled with the via. The via and the upper wiring layer are fabricated by filling a via hole and a wiring groove formed in an interlayer insulating film that is formed on the lower wiring layer with a wiring material. The photo mask has a via alignment mark which is used for aligning the via hole with respect to the lower wiring layer and/or a via alignment mark which is used for aligning the wiring groove with respect to the via hole. The width of the via alignment mark is equal to or larger than the width which is optically detectable and an aspect ratio of the via alignment mark is equal to or larger than one fourth of the aspect ratio of the via hole. Preferably, the width of the via alignment mark is equal to or larger than the width of the via hole.

20 Claims, 11 Drawing Sheets

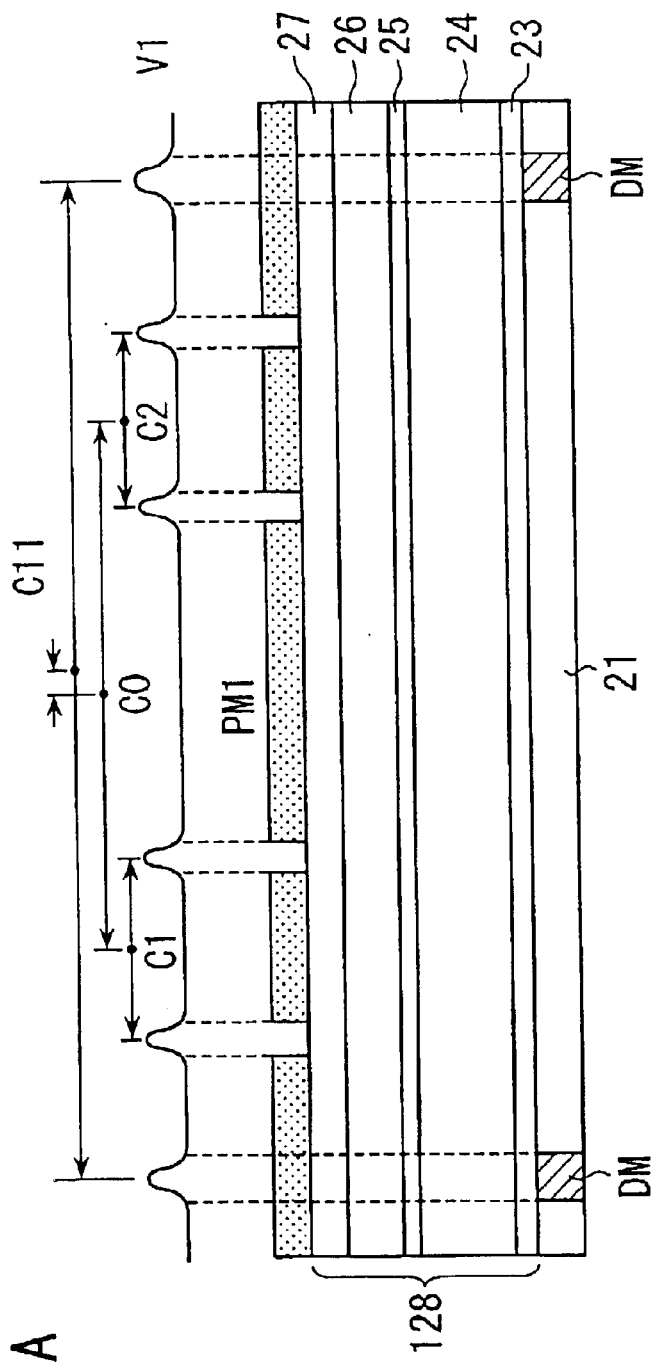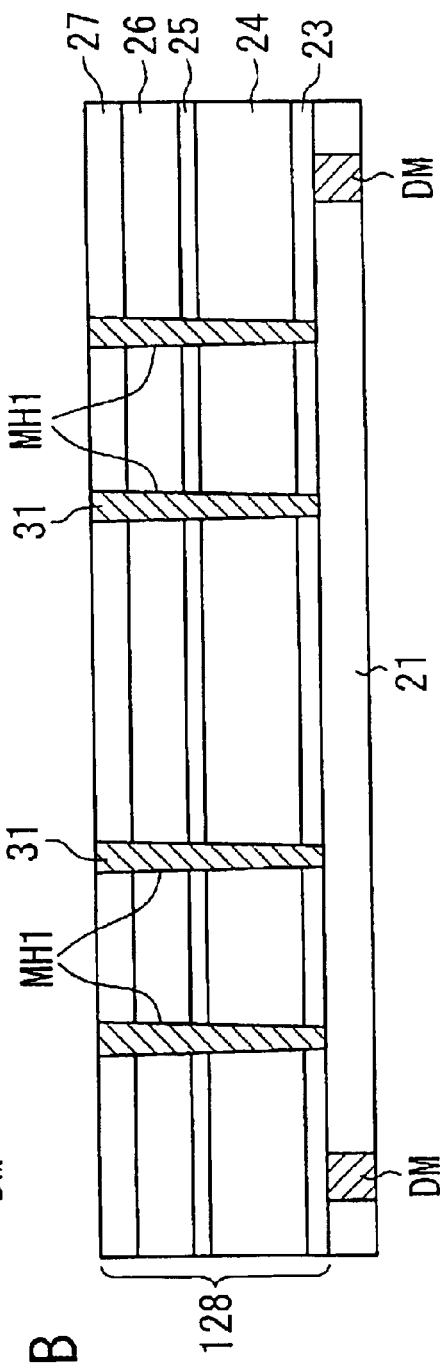
FIG. 5A
FIG. 5B

PRIOR ART

PRIOR ART

US 6,821,687 B2

PHOTO MASK FOR FABRICATING SEMICONDUCTOR DEVICE HAVING DUAL DAMASCENE STRUCTURE

FIELD OF THE INVENTION

The present invention relates generally to a method of manufacturing a semiconductor device having a dual damascene structure in which a via for electrically coupling a lower wiring layer and an upper wiring layer and the upper wiring layer are buried within an interlayer insulating film. More particularly, the present invention relates to a photo mask used when a via hole for forming a via and a wiring trench or groove for forming the wiring conductor of the upper wiring layer are opened, and to a method of manufacturing a semiconductor device which uses such photo mask.

BACKGROUND OF THE INVENTION

According to an increase in an integration degree and a packing density of a semiconductor device, a dual damascene structure has become often used. In the dual damascene structure, a via for electrically coupling a lower wiring layer and an upper wiring layer and a wiring conductor of the upper wiring layer are buried within an interlayer insulating film. In the dual damascene structure, a via hole which is an opening for forming a via that electrically couples with a lower wiring layer and a wiring trench or groove for forming a wiring conductor of an upper wiring layer that extends in an area including the via are formed one after another in an interlayer insulating film by using a photolithography technology. Thereafter, the opening of the via hole and the wiring groove are filled with a wiring material. The upper surface of the workpiece substrate is then polished flat and the wiring material on the interlayer insulating film is removed. Such manufacturing method is described, for example, in Japanese patent laid-open publication No. 2000-150641.

FIGS. 9A–9E are cross sectional views each illustrating a structure of a workpiece obtained during a process of fabricating a dual damascene structure according to a conventional technology, which is substantially the same as the technology described in the above-mentioned Japanese patent laid-open publication.

First, as shown in FIG. 9A, a groove formed in a base insulating film or layer 121 on a semiconductor substrate not shown in the drawing is filled with a metal such as copper and the like, and the upper surface is planarized or flattened to form a lower wiring layer 122 having predetermined wiring patterns. On the lower wiring layer 122, an $Si_3N_4$ film 123, an $SiO_2$ film 124, an SiC film 125, an HSQ film 126 and an $SiO_2$ film 127 are formed one after another in this order, thereby an interlayer insulating film 128 comprising these film is formed.

As shown in FIG. 9B, by using a first photolithography process in which a first photo resist PR11 is used, the interlayer insulating film 128 is selectively etched to form a via hole 129 in an area where a via or a via conductor is to be formed such that the via hole 129 reaches the $Si_3N_4$ film 123.

Next, as shown in FIG. 9C, by using a second photolithography process in which a second photo resist PR12 is used, the interlayer insulating film 128 is selectively etched to form a wiring groove 130 in a predetermined area which includes the via hole 129 and where the wiring groove 130 is to be formed such that the wiring groove 130 reaches the SiC film 125.

Thereafter, to obtain the structure shown in FIG. 9D, the portion of the $Si_3N_4$ film 123 at the bottom surface of the via hole 129 is selectively etched and removed to expose the surface of the lower wiring layer 22. A wiring material 131 comprising a metal such as copper and the like is sputtered on whole area of the workpiece to fill the via hole 129 and the wiring groove 130 with the metal. Then, the surface of the workpiece is planarized by using a CMP (chemical mechanical polishing) method, and a structure is obtained in which the wiring material 131 remains and is buried only within the via hole 129 and the wiring groove 130. Thereby, the via 132 which is electrically coupled with the lower wiring layer 122 and the upper wiring layer 133 which is electrically coupled with the via 132 and thus the lower wiring layer 122 are formed.

In this way, when the dual damascene structure is fabricated, the first and second photolithography processes are required. Therefore, in the first photolithography process, an alignment technology is required in which the location or position of the via hole 129 is aligned with respect to the location of the lower wiring layer 22. Also, in the second photolithography process, an alignment technology is required in which the location of the wiring groove 130 is aligned with respect to the location of the via hole 129. In order to perform these alignment, it is necessary to provide alignment marks in first and second photo masks which are used for exposing, developing and patterning first and second photo resist films used in the first and second photolithography processes, respectively. In the first photolithography process, the alignment mark of the first photo mask is aligned with a lower layer alignment mark which is formed simultaneously with the lower wiring layer. In the second photolithography process, the alignment mark of the second photo mask is aligned with an alignment hole which is formed simultaneously with the via hole by using the alignment mark of the first photo mask.

FIG. 10A is a schematic plan view showing an alignment mark used when an alignment is performed in the first photolithography process. FIG. 10B is a cross sectional view of a workpiece of a semiconductor device formed by using the alignment mark of FIG. 10A. FIG. 10C is a cross sectional view illustrating a via alignment hole formed simultaneously with a via hole in the first photolithography process.

As shown in FIGS. 10A and 10B, by using a part of the lower wiring layer 122, a lower layer alignment mark DM11 is previously formed which has a square frame like shape. Also, in the first photo mask, a first via alignment mark M11 is formed which has a square shape and which is to be located at the central position of the lower layer alignment mark DM11. By using the first photo mask, the first photolithography process is performed, and by using the first photo resist pattern PR11 which is obtained by exposing and developing the first photo resist, the via hole 129 is opened in the interlayer insulating film 128. In this case, the first photo resist pattern PR11 formed by the first via alignment mark M11 and the lower layer alignment mark DM11 are optically scanned by a misalignment measuring equipment or apparatus in a direction shown by an arrow S11 in FIG. 10A. The reflection of light obtained from the optical scanning is detected and a signal output V11 shown in the upper portion of FIG. 10B is obtained. Based on the signal output V11, a relative locational difference between the central location C21 of the first photo resist pattern PR11 by the first via alignment mark M11 and the central location C22 of the lower layer alignment mark DM11 is detected, and thereby alignment between the first via alignment mark M11 and the lower layer alignment mark DM11 is performed.

FIG. 11A is a schematic plan view showing an alignment mark used when an alignment is performed in the second photolithography process. FIG. 11B is a cross sectional view of a workpiece of a semiconductor device formed by using the alignment mark of FIG. 11A. FIG. 11C is a cross sectional view illustrating a upper layer alignment hole formed simultaneously with a wiring groove in the second photolithography process.

In this case, as shown in FIGS. 11A and 11B, in the first photo mask used in the first photolithography process, a second via alignment mark M12 is previously formed which has a square frame like shape. Thereby, the second via alignment hole MH12 is opened in the interlayer insulating film 128 simultaneously with the forming of the via hole 129. Also, in the second photo mask, an upper layer alignment mark UM11 is formed which has a square shape and which is to be located at the central position of the frame of the second via alignment mark MH12. By using the second photo mask, the second photolithography process is performed, and the second photo resist pattern PR12 is formed. By the etching which uses the second photo resist pattern PR12, the wiring groove is opened which reaches the SiC film 125 of the interlayer insulating film 128. In this case, the second via alignment hole MH12 and the second photo resist pattern PR12 formed by the upper layer alignment mark UM are optically scanned by a misalignment measuring equipment in a direction shown by an arrow S12 in FIG. 11A. The reflection of light obtained from the optical scanning is detected and a signal output V12 shown in the upper portion of FIG. 11B is obtained. Based on the signal output V12, a relative locational difference between the central location C31 of the second via alignment hole MH12 and the central location C32 of the second photo resist pattern PR12 is detected, and thereby alignment between the second via alignment hole MH12 and the second photo resist pattern PR12 is performed.

In the above-mentioned alignment in the first photolithography process, since the width of the first via alignment mark M11 is approximately 1.0 µm and is relatively large, when the reflected light is detected from the via alignment mark in the process of alignment, the reflection of light at the via alignment mark becomes gradual and it is difficult to detect the peak of the output signal V11. As a result, it becomes difficult to perform precise alignment. Also, as shown in FIG. 10C, since the width of the first via alignment mark M11 is relatively large, a via alignment hole MH11 which is formed in the interlayer insulating film 128 simultaneously with the via hole 129 in the first photolithography process has a smaller aspect ratio with respect to the film thickness of approximately 1.0 µm of the interlayer insulating film 128 than the aspect ratio of a usual or proper via hole. Therefore, etching progresses rapidly, and when the first photolithography process is performed, the Si$_3$N$_4$ film 123 as an etch stopper film is also etched and over etching occurs into a base insulating film 121 at the lower layer. In this way, when the via alignment hole having a large width is formed into the interlayer insulating film 128 deeply, the following disadvantage occurs. That is, when the wiring material 131 is buried into the via alignment hole MH11, the surface portion of the via alignment hole MH11 becomes concave. It is sometimes impossible to remove such concave portion even by using the CMP process and, therefore, slurry produced in the CMP process gathers in the concave portion, or air is confined in the concave portion in a later process. In such case, moisture and/or air in the slurry expand in a heat treatment process performed later, and sometimes cause damage such as cracking of the interlayer insulating film 128 and the like. Also, due to the concavity, there occurs a difference in height between the concave portion and the peripheral area and such difference sometimes has an influence on the pattern accuracy in a photolithography process thereafter.

In the above-mentioned alignment in the second photolithography process, the width of the second via alignment mark M12 is relatively large and the width of the upper layer alignment mark UM11 is relatively large. Therefore, similarly to the first photolithography process, when the alignment is performed, the reflection of light by the upper layer alignment mark UM at the second photo resist pattern PR12 becomes gradual and it is difficult to detect the peak of the output signal V12. As a result, it becomes difficult to perform precise alignment. Also, as shown in FIG. 11C, since, in the second photolithography process, the upper layer alignment hole UH11 having a relatively large width is opened or formed in the interlayer insulating film 128 simultaneously with the opening of the wiring groove 130. Therefore, when the wiring material 131 is buried into the upper layer alignment hole UH11, the surface portion of the upper layer alignment hole UH11 becomes concave. Due to such concavity, in the second photolithography process, disadvantages similar to those in the first photolithography process arise. Also, the second via alignment hole MH12 has a relatively large width. Therefore, when, as shown in FIG. 11B, an anti-reflection film NR11 is coated as a lower layer film of the second photo resist pattern PR12 in the second photolithography process, a large quantity of material of the anti-reflection film NR11 flows into the second via alignment hole MH12. As a result, there is produced unevenness in the particular area of the interlayer insulating film 128, and also there is produced coating spot or unevenness between the particular area and the peripheral area, so that there arises a possibility that the shape of the patterns of the photo resist formed thereafter is deteriorated.

SUMMARY OF THE INVENTION

Therefore, it is an object of the present invention to provide a photo mask and a method of manufacturing a semiconductor device using the photo mask which provides a high alignment precision in semiconductor manufacturing.

It is another object of the present invention to provide a photo mask and a method of manufacturing a semiconductor device using the photo mask in which a concave portion and a difference in step height are not produced in a wiring material portion at an alignment hole and the like.

It is still another object of the present invention to provide a photo mask and a method of manufacturing a semiconductor device using the photo mask in which a precision of patterning in a photolithography process in a later process is not deteriorated.

It is still another object of the present invention to obviate the disadvantages of a conventional photo mask and a conventional method of manufacturing a semiconductor device using the photo mask.

According to an aspect of the present invention, there is provided a photo mask for fabricating a semiconductor device having a dual damascene structure which has a via coupled with a lower wiring layer and has an upper wiring layer coupled with the via, the via and the upper wiring layer being fabricated by filling a via hole and a wiring groove formed in an interlayer insulating film that is formed on the lower wiring layer with a wiring material, the photo mask having: a via alignment mark which is used for aligning the via hole with respect to the lower wiring layer; wherein the width of the via alignment mark is equal to or larger than the width which is optically detectable and an aspect ratio of the via alignment mark is equal to or larger than one fourth of the aspect ratio of the via hole.

In this case, it is preferable that the via alignment mark comprises two sets of straight line shaped strips, one set of the straight line shaped strips having at least a pair of straight line shaped patterns which are opposed to each other in X direction in a plane and the other set of the straight line shaped strips having at least a pair of straight line shaped patterns which are opposed to each other in Y direction in the same plane.

It is also preferable that the two sets of straight line shaped strips are disposed parallel to a lower layer alignment mark which is formed simultaneously with the lower wiring layer.

It is further preferable that one set of the straight line shaped strips comprises a pair of frame like patterns each of which has an elongated rectangular frame shape and which are opposed to each other in X direction and the other set of the straight line shaped strips comprises a pair of frame like patterns each of which has an elongated rectangular frame shape and which are opposed to each other in Y direction, such that the four frame like patterns constitute a square or a rectangular shape.

It is advantageous that the via alignment mark comprises a frame like square or rectangular shaped strip.

According to another aspect of the present invention, there is provided a photo mask for fabricating a semiconductor device having a dual damascene structure which has a via coupled with a lower wiring layer and has an upper wiring layer coupled with the via, the via and the upper wiring layer being fabricated by filling a via hole and a wiring groove formed in an interlayer insulating film that is formed on the lower wiring layer with a wiring material, the photo mask having: a via alignment mark which is used for aligning the wiring groove with respect to the via hole; wherein the width of the via alignment mark is equal to or larger than the width which is optically detectable and an aspect ratio of the via alignment mark is equal to or larger than one fourth of the aspect ratio of the via hole.

In this case, it is preferable that the via alignment mark comprises two sets of straight line shaped strips, one set of the straight line shaped strips having at least a pair of straight line shaped patterns which are opposed to each other in X direction in a plane and the other set of the straight line shaped strips having at least a pair of straight line shaped patterns which are opposed to each other in Y direction in the same plane.

It is also preferable that the two sets of straight line shaped strips are disposed parallel to an upper layer alignment mark which is formed simultaneously with the upper wiring layer.

It is further preferable that one set of the straight line shaped strips comprises a pair of frame like patterns each of which has an elongated rectangular frame shape and which are opposed to each other in X direction and the other set of the straight line shaped strips comprises a pair of frame like patterns each of which has an elongated rectangular frame shape and which are opposed to each other in Y direction, such that the four frame like patterns constitute a square or a rectangular shape.

It is advantageous that the via alignment mark comprises a frame like square or rectangular shaped strip.

According to still another aspect of the present invention, there is provided a method of manufacturing a semiconductor device having a dual damascene structure, the method comprising: forming a via hole in an interlayer insulating film formed on a lower wiring layer; forming a wiring groove in the interlayer insulating film which includes the via hole; filling the via hole and the wiring groove with a wiring material; flattening the surface of the wiring material together with the surface of the interlayer insulating film such that the wiring material remains in the via hole and the wiring groove, thereby forming a via and an upper wiring layer; wherein, in forming the via hole in the interlayer insulating film formed on the lower wiring layer, the via hole is formed by a photolithography process that uses a photo mask having a via alignment mark which is used for aligning the via hole with respect to the lower wiring layer; and wherein the width of the via alignment mark is equal to or larger than the width which is optically detectable and an aspect ratio of the via alignment mark is equal to or larger than one fourth of the aspect ratio of the via hole.

In this case, it is preferable that the via alignment mark comprises two sets of straight line shaped strips, one set of the straight line shaped strips having at least a pair of straight line shaped patterns which are opposed to each other in X direction in a plane and the other set of the straight line shaped strips having at least a pair of straight line shaped patterns which are opposed to each other in Y direction in the same plane.

It is also preferable that the two sets of straight line shaped strips are disposed parallel to a lower layer alignment mark which is formed simultaneously with the lower wiring layer.

It is further preferable that one set of the straight line shaped strips comprises a pair of frame like patterns each of which has an elongated rectangular frame shape and which are opposed to each other in X direction and the other set of the straight line shaped strips comprises a pair of frame like patterns each of which has an elongated rectangular frame shape and which are opposed to each other in Y direction, such that the four frame like patterns constitute a square or a rectangular shape.

It is advantageous that the via alignment mark comprises a frame like square or rectangular shaped strip.

According to still another aspect of the present invention, there is provided a method of manufacturing a semiconductor device having a dual damascene structure, the method comprising: forming a via hole in an interlayer insulating film formed on a lower wiring layer; forming a wiring groove in the interlayer insulating film which includes the via hole; filling the via hole and the wiring groove with a wiring material; flattening the surface of the wiring material together with the surface of the interlayer insulating film such that the wiring material remains in the via hole and the wiring groove, thereby forming a via and an upper wiring layer; wherein, when forming the wiring groove in an interlayer insulating film which includes the via hole, the wiring groove is formed by a photolithography process that uses a photo mask having a via alignment mark which is used for aligning the wiring groove with respect to the via hole; wherein the width of the via alignment mark is equal to or larger than the width which is optically detectable and an aspect ratio of the via alignment mark is equal to or larger than one fourth of the aspect ratio of the via hole.

In this case, it is preferable that the via alignment mark comprises two sets of straight line shaped strips, one set of the straight line shaped strips having at least a pair of straight line shaped patterns which are opposed to each other in X direction in a plane and the other set of the straight line shaped strips having at least a pair of straight line shaped patterns which are opposed to each other in Y direction in the same plane.

It is also preferable that the two sets of straight line shaped strips are disposed parallel to an upper layer alignment mark which is formed simultaneously with the upper wiring layer.

It is further preferable that one set of the straight line shaped strips comprises a pair of frame like patterns each of which has an elongated rectangular frame shape and which are opposed to each other in X direction and the other set of the straight line shaped strips comprises a pair of frame like patterns each of which has an elongated rectangular frame shape and which are opposed to each other in Y direction, such that the four frame like patterns constitute a square or a rectangular shape.

It is advantageous that the via alignment mark comprises a frame like square or rectangular shaped strip.

According to the above-mentioned aspects of the present invention, each of the via alignment marks is constituted of strips (or slits) each having a minute width. Therefore, it is possible to detect, for example, by an optical detecting method, the central location or position between the strips, that is, the central position between the via alignment marks, with high precision, and to perform alignment of the lower layer alignment mark and the upper layer alignment mark with high precision. Also, each of the alignment holes formed by using the via alignment mark has a minute width and has an aspect ratio close to an aspect ratio of proper via holes. Therefore, etching of the alignment holes does not progress more rapidly than etching of the proper via holes, and the lower layer insulating film is not over-etched. Thus, the interlayer insulating film in the areas near the alignment holes is not etched excessively, and undesirable unevenness of the upper surface of the interlayer insulating film does not occur in such areas with respect to the peripheral area thereof. Further, when the alignment holes are filled with wiring material such as copper and the like and the interlayer insulating film is flattened by the CMP process and the like, concave portions are not produced at the upper surface portions of the alignment holes. Therefore, the surface of the interlayer insulating film becomes flat, and pattern accuracy and the like in a photolithography process thereafter is not deteriorated by the unevenness of the surface of the workpiece. Further, slurry and/or air do not remain in the concave portion. As a result, it becomes possible to fabricate semiconductor devices having high reliability.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which:

FIG. 5A is an enlarged cross sectional view illustrating a process of detecting an alignment between the lower layer alignment mark DM and the first via alignment pattern PM1 corresponding to the first via alignment mark M1, in the first photolithography process shown in FIG. 3B;

FIG. 5B is an enlarged cross sectional view illustrating a condition of the workpiece in which the first via alignment holes MH1 are opened in the interlayer insulating film, in the process illustrated with reference to FIG. 3C;

DESCRIPTION OF A PREFERRED EMBODIMENT

With reference to the drawings, embodiments of the present invention will be described in detail.

Figure 1A:
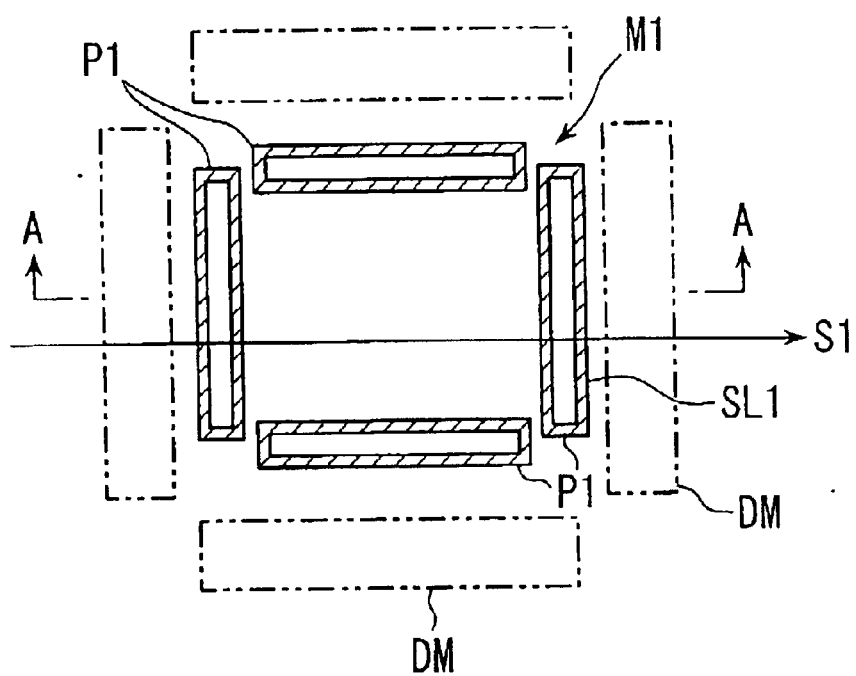
FIG. 1A is a plan view illustrating a first via alignment mark which is applied to a photo mask according to an embodiment of the present invention.
Figure 1B:
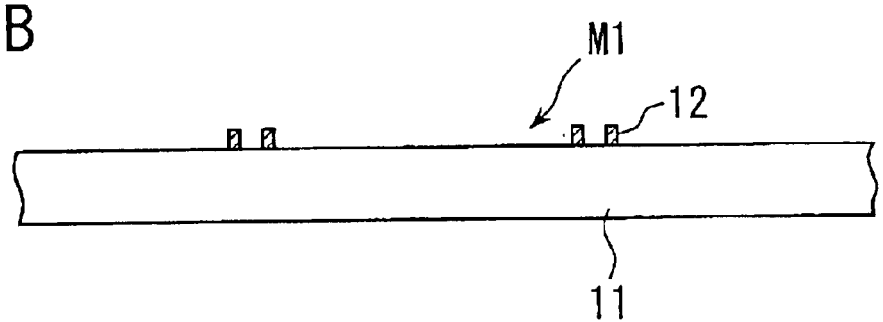
FIG. 1B is a cross sectional view taken along the line A—A of FIG. 1A.

FIG. 1A is a plan view illustrating a first via alignment mark which is applied to a photo mask according to an embodiment of the present invention. FIG. 1B is a cross sectional view taken along the line A—A of FIG. 1A.

The first via alignment mark M1 shown in FIGS. 1A and 1B is provided in a first photo mask used in a first photolithography process in which a via hole is opened in an interlayer insulating film formed on a lower wiring layer as mentioned later. It is assumed that a photo resist used here is a positive type photo resist. The first via alignment mark M1 is formed as predetermined patterns on a transparent glass substrate 11 of a first photo mask by using a metal film 12 made of chromium (Cr) and the like which does not transmit light. In this embodiment, the first via alignment mark M1 comprises four frame like patterns P1 each of which has an elongated rectangular frame shape. Two of the frame like patterns P1 are opposed to each other in X direction and the other two of the frame like patterns P1 are opposed to each other in Y direction such that the four frame like patterns P1 constitute a square or a rectangular shape. Each of the frame like patterns P1 has a short side length of approximately 2–3 μm, and a long side length of approximately 15–18 μm. An endless loop shaped strip portion SL1 of each of the frame like patterns P1 has a width of approximately 0.5 μm.

As shown by two dot chain lines (imaginary lines) in FIG. 1A, the first via alignment mark M1 is aligned with respect to a lower layer alignment mark DM which is formed by using a part of a lower wiring layer. The lower layer alignment mark DM is constituted of four straight line patterns which are disposed such that the four straight line patterns surround the outside of the first via alignment mark M1. Each of the four straight line patterns has an elongated rectangular shape which has a width of approximately 10 μm and a length of approximately 20–25 μm. Two of the straight line patterns are opposed to each other in X direction such that the two of the straight line patterns become parallel with two of the frame like patterns P1. The other two of the straight line patterns are opposed to each other in Y direction such that the other two of the straight line patterns become parallel with other two of the frame like patterns P1. Therefore, the four straight line patterns constitute a square or a rectangular area within which the first via alignment mark M1 is contained.

Figure 2A:
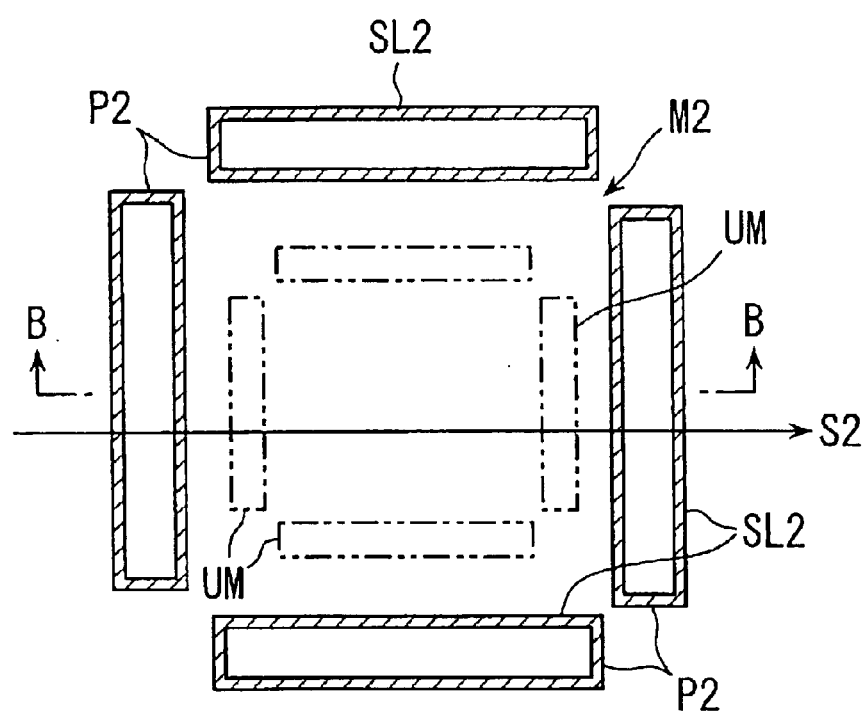
FIG. 2A is a plan view illustrating a second via alignment mark which is disposed in another area of the first photo mask and which is an alignment mark used in a second photolithography process.
Figure 2B:
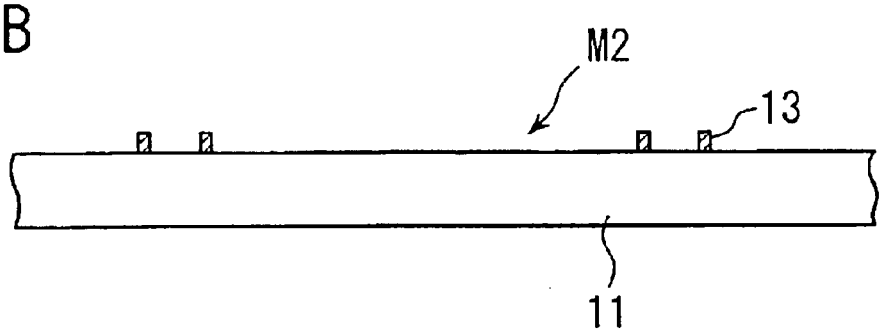
FIG. 2B is a cross sectional view taken along the line B—B of FIG. 2A.

FIG. 2A is a plan view illustrating a second via alignment mark which is disposed in another area of the first photo mask and which is an alignment mark used in a second photolithography process. FIG. 2B is a cross sectional view taken along the line B—B of FIG. 2A.

The second via alignment mark M2 shown in FIGS. 2A and 2B has basically the same structure as that of the first via alignment mark M1. The second via alignment mark M2 is formed as predetermined patterns on the transparent glass substrate 11 of the first photo mask by using a metal film 13 made of chromium (Cr) and the like which does not transmit light. In this embodiment, the second via alignment mark M2 comprises four frame like patterns P2 each of which has an elongated rectangular frame shape. Two of the frame like patterns P2 are opposed to each other in X direction and the other two of the frame like patterns P2 are opposed to each other in Y direction such that the four frame like patterns P2 constitute a square or a rectangular shape. Each of the frame like patterns P2 has a short side length of approximately 10 μm, and a long side length of approximately 20–25 μm. An endless loop shaped strip portion SL2 of each of the frame like patterns P2 has a width of approximately 0.5 μm.

As shown by two dot chain lines (imaginary lines) in FIG. 2A, the second via alignment mark M2 is aligned with respect to upper layer alignment holes UH (upper layer alignment mark UM) which are formed in the second photolithography process performed later and which are formed simultaneously with the wiring groove. The upper layer alignment mark UM is formed in the second photo mask (not shown in the drawing) and is constituted of four straight line patterns which are disposed within a square or rectangular area defined by the above-mentioned second via alignment mark M2. Each of the four straight line patterns of the upper layer alignment mark UM has an elongated rectangular shape which has a width of approximately 2–3 μm and a length of approximately 15–18 μm. Two of the straight line patterns are opposed to each other in X direction such that the two of the straight line patterns become parallel with two of the frame like patterns P2. The other two of the straight line patterns are opposed to each other in Y direction such that the other two of the straight line patterns become parallel with other two of the frame like patterns P2.

With reference to FIGS. 3A–3C and FIGS. 4A–4D, a method of manufacturing a dual damascene structure according to the present invention is explained. In this method, the first photo mask having the first and second via alignment marks M1 and M2, and the second photo mask having the upper layer alignment mark UM are used. In each of these drawings, both a main circuit portion (CP1 or CP2) in which the dual damascene structure is formed in a semiconductor device and an alignment portion (AP1 or AP2) which is used for performing an alignment of the main circuit portion are shown together.

Figure 3A:
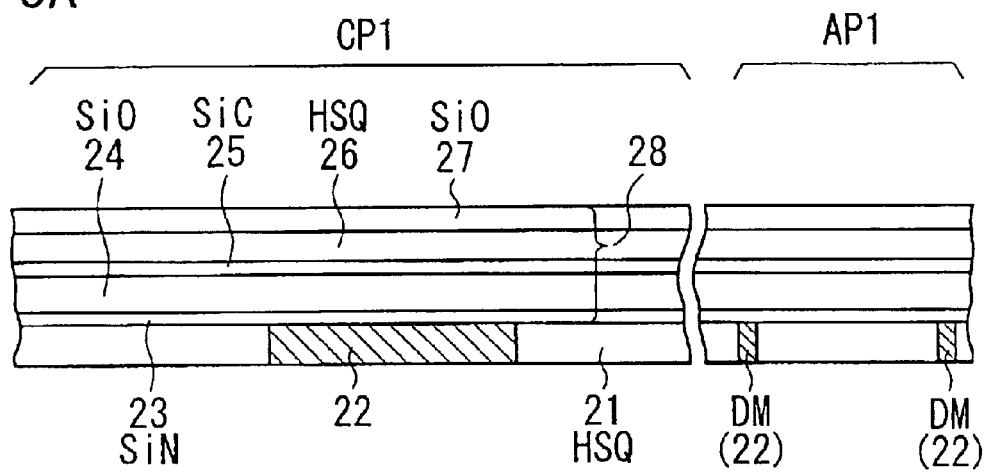
FIGS. 3A–3C are cross sectional views each illustrating a structure of a workpiece obtained during a process of manufacturing a dual damascene structure according to the present invention.

First, as shown in FIG. 3A, a groove formed in an HSQ film 21 as a base insulating film which is formed on a semiconductor substrate not shown in the drawing and which has a film thickness of, for example, 250 nm is filled with a metal such as copper (Cu) and the like, and the upper surface is flattened or planarized to form a lower wiring layer 22 having predetermined wiring patterns. In this case, simultaneously with the predetermined wiring patterns in the main circuit portion CP1, the above-mentioned lower layer alignment mark DM shown by two dot chain lines in FIG. 1A is also formed by using a part of lower wiring layer 22 in the alignment portion AP1. Here, a detailed explanation of a method of manufacturing the lower wiring layer 22 is omitted.

Then, on the lower wiring layer 22, a plasma $Si_3N_4$ film 23 having a film thickness of 70 nm, a plasma $SiO_2$ film 24 having a film thickness of 450 nm, a plasma SixCy film 25 having a film thickness of 50 nm, an HSQ film 26 having a film thickness of 250 nm and a plasma $SiO_2$ film 27 having a film thickness of 200 nm are formed one after another in this order, thereby an interlayer insulating film 28 comprising these films is formed.

Figure 3B:
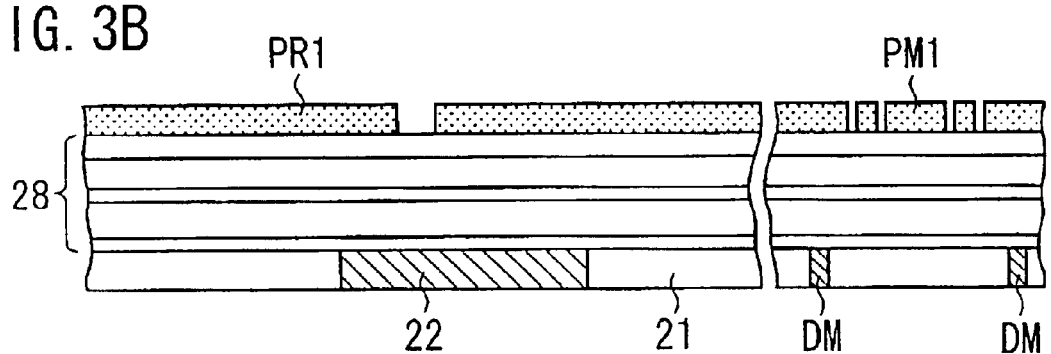
Figure 3C:
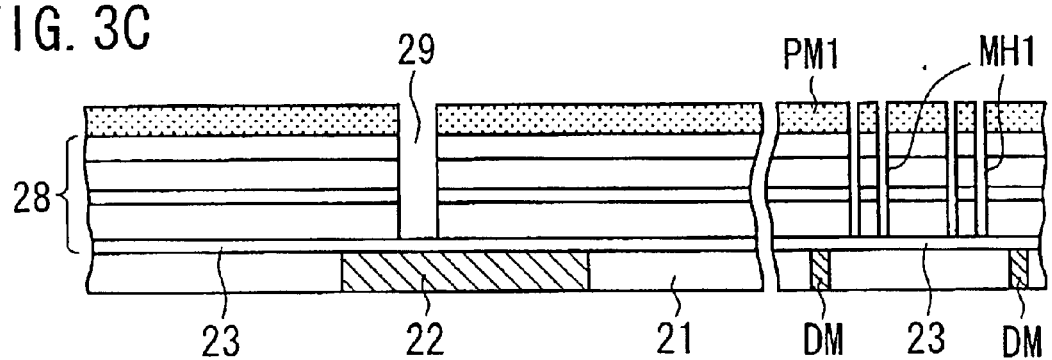

As shown in FIG. 3B, a first photo resist is applied on whole area of the workpiece. Then, the first photo resist is exposed by using the first photo mask and is developed to form a first photo resist pattern PR1. Then, by using via alignment pattern PM1 which is formed in a part of the first photo resist pattern PR1 and which corresponds to the first via alignment mark M1, and by using the lower layer alignment mark DM, an optical scanning is performed by using a misalignment measuring equipment not shown in the drawing and a reflected light signal obtained thereby is read out to perform the alignment. When the alignment is satisfactory, as shown in FIG. 3C, by using the first photo resist pattern PR1, the interlayer insulating film 28 is etched and thereby a via hole 29 having a depth reaching the above-mentioned $Si_3N_4$ film 23 is formed. An etching gas used in this case is, for example, $C_3F_8$+CO gas, and a diameter of the via hole 29 is approximately 0.2 μm. At the same time, in the first alignment portion AP1 in the interlayer insulating film 28, first via alignment holes MH1 corresponding to the first via alignment mark M1 are opened. The first via alignment holes MH1 are opened as slits or trenches each having a width of 0.5 μm. Therefore, over-etching beyond the $Si_3N_4$ film 23 up to the lower layer insulating film 21 does not occur like the conventional alignment hole having a large width. Thereafter, the first photo resist PR1 is removed.

Figure 4A:
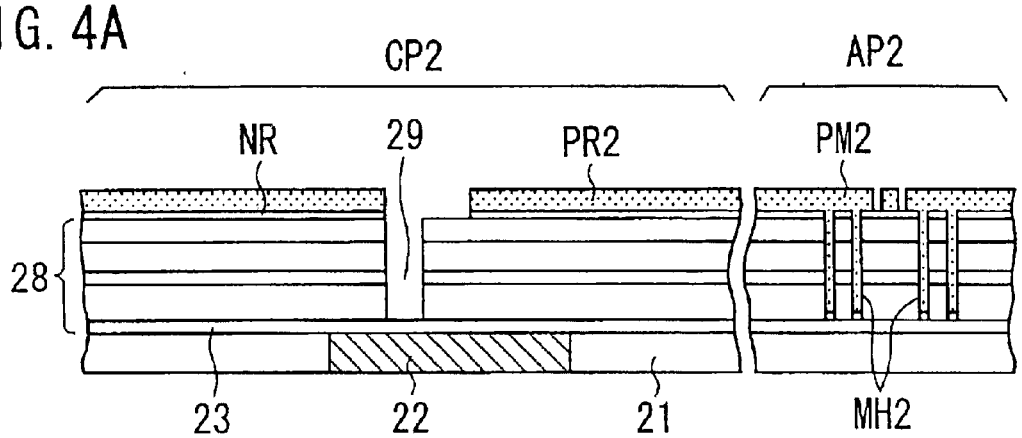
FIGS. 4A–4D are cross sectional views each illustrating a structure of a workpiece obtained after the structures of FIGS. 3A–3C during a process of manufacturing a dual damascene structure according to the present invention.
Figure 4B:
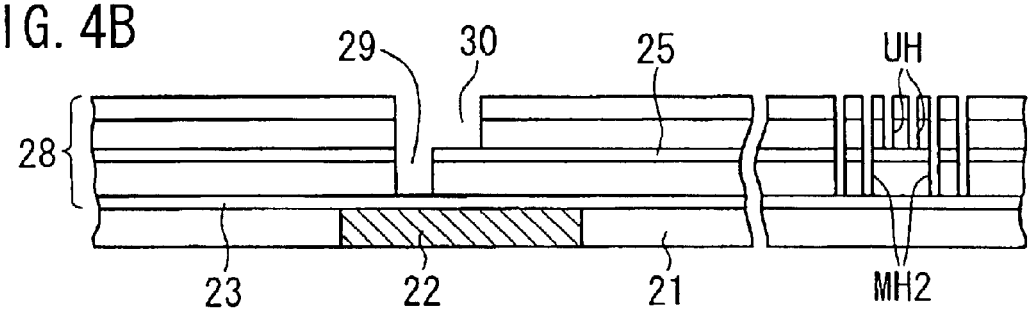

Also, as shown in FIG. 4A, in the second alignment portion AP2 of the interlayer insulating film 28, second via alignment holes MH2 are opened by the second via alignment mark M2 in a manner similar to the first via alignment hole MH1, simultaneously with the formation of the first via alignment hole MH1 and the via hole 29. Thereafter, an antireflection film NR is coated on whole surface of the workpiece. Further, a second photo resist is applied, and the second photo resist is exposed by using the second photo mask and is developed to form a second photo resist pattern PR2. Then, by using via an upper layer alignment pattern PM2 which is formed in a part of the second photo resist pattern PR2 and which corresponds to the upper layer alignment mark UM, and by using the second via alignment holes MH2 formed in the interlayer insulating film 28 by using the second via alignment mark M2, an optical scanning is performed by using a misalignment measuring equipment not shown in the drawing and a reflected light signal obtained thereby is read out to perform the alignment, as mentioned in detail later. After the alignment, as shown in FIG. 4B, by using the second photo resist pattern PR2, the interlayer insulating film 28 is etched to a depth reaching the SixCy film 25, and thereby the wiring groove 30 is formed. At the same time, in the second alignment portion AP2 in the interlayer insulating film 28, upper layer alignment holes UH corresponding to the upper layer alignment mark UM are opened.

Figure 4C:
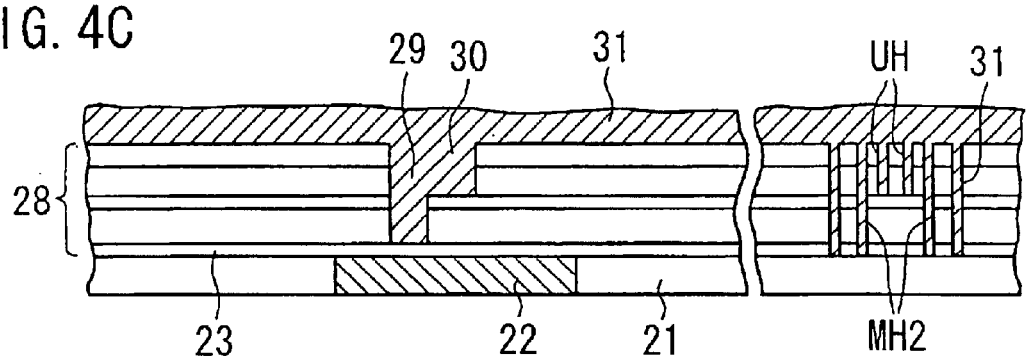

Then, as shown in FIG. 4C, after removing the second photo resist PR2 and the anti reflection film NR, a portion of the $Si_3N_4$ film 23 at the bottom surface of the via hole 29 is selectively etched and removed to expose the surface of the lower wiring layer 22 within the via hole 29. A wiring material comprising a metal such as copper and the like is sputtered on whole area of the workpiece to fill the via hole 29 and the wiring groove 30 with the metal.

Figure 4D:
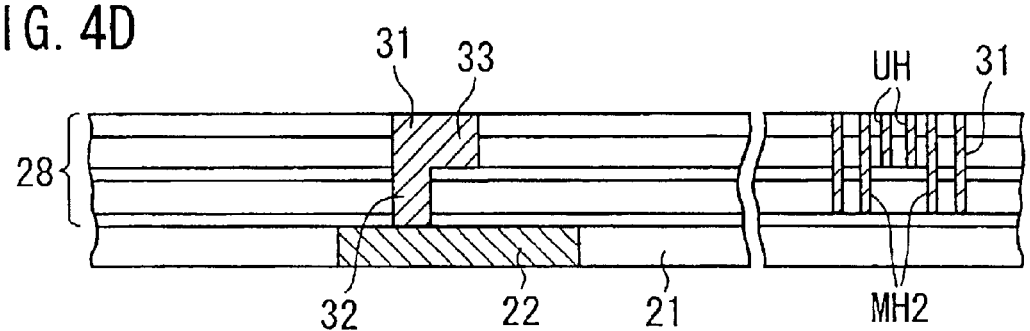

As shown in FIG. 4D, then, the surface of the workpiece is planarized by using a CMP (chemical mechanical polishing) method, and the wiring material on the interlayer insulating film 28 is removed. Thereby, the wiring material 31 is buried within the via hole 29 and the wiring groove 30 of the interlayer insulating film 28. Thereby, a dual damascene structure is fabricated which comprises the via 32 electrically coupled with the lower wiring layer 22 and the upper wiring layer 33 electrically coupled with the lower wiring layer 22 through the via 32. In the process of filling the wiring material 31 and the CMP process mentioned above, the first via alignment hole MH1 in the first alignment portion AP1, the second via alignment hole MH2 in the second alignment portion AP2 and the upper layer alignment hole UH are also filled with the wiring material 31.

FIG. 5A is an enlarged view illustrating a process of detecting an alignment between the lower layer alignment mark DM and the first via alignment pattern PM1 (first photo resist pattern PR1) corresponding to the first via alignment mark M1, in the first photolithography process shown in FIG. 3B. Here, a waveform V1 shown in the upper portion of FIG. 5A is an output signal obtained when an optical scanning is performed along the line S1 shown in FIG. 1A by using a misalignment measuring equipment. As can be seen from the waveform of the output signal V1, each of the frame like patterns P1 of the first via alignment mark M1 has a pair of opposing strips SL1 each having a relatively narrow width of approximately 0.5 μm. Therefore, it is possible to detect the locations of these strips SL1 and it is possible to detect, with high precision, the central locations or positions C1 and C2 each of which is the central location between the pair of opposing strips SL1. Thus, from these central locations C1 and C2, it is possible to detect the central location C0 of the first via alignment mark M1 with high precision. At the same time, it is also possible to detect the central location C11 of the lower layer alignment mark DM. Therefore, from these information, it is possible to perform an alignment of the first via alignment mark M1 with respect to the lower layer alignment mark DM. It is also possible to make the width of each of the strips SL1 smaller than 0.5 μm. However, when the width of each strip SL1 is smaller than 0.5 μm, it becomes rather difficult to optically detect the location of the strip by using the misalignment measuring equipment. Therefore, as long as the present misalignment measuring equipment is used, it is desirable that the width of each strip is equal to or larger than the diameter of the via hole, and it is preferable that the width of each strip is equal to or larger than 0.5 μm.

In practice, an alignment error between the lower layer alignment mark DM and the first via alignment pattern PM1 (first photo resist pattern PR1) corresponding to the first via alignment mark M1 is detected in a manner mentioned above, and if the alignment error is allowable, that is, is smaller than a predetermined threshold value, it is possible to use the patterned photo resist pattern is used in a process thereafter. If the alignment error is not allowable, that is, is larger than the predetermined threshold value, it is possible to remove the patterned photo resist film and to form the first photo resist pattern PR1 again.

FIG. 5B is an enlarged view illustrating a condition of the workpiece in which the first via alignment holes MH1 are opened in the interlayer insulating film 28, in the process described with reference to FIG. 3C. Here, the width of each frame portion of the first via alignment holes MH1 is 0.5 μm, and each frame portion has an aspect ratio which is relatively close to the aspect ratio of the via hole 29 formed in the main circuit portion when compared with that of the conventional via alignment holes. Therefore, it is not possible that etching of the first via alignment holes MH1 progresses more rapidly than the etching of the via hole 29 and it is not possible that the $Si_3N_4$ film 23 and the lower layer insulating film 21 are over-etched. Thus, portions of the interlayer insulating film 28 in areas near the first via alignment holes MH1 are not etched excessively, and undesirable unevenness does not occur in such portions. Also, since the width of each of the first via alignment holes MH1 is relatively small, when the first via alignment holes MH1 are filled with the wiring material 31 such as copper and the like, concave portions are not produced at the upper surface portions of the first via alignment holes MH1. Therefore, the surface of the interlayer insulating film 28 becomes flat and even, and pattern accuracy and the like in a photolithography process thereafter is not deteriorated by the unevenness of the surface like the conventional photo mask. Further, slurry and/or air do not remain in the concave portion.

Figures 6A, 6B:
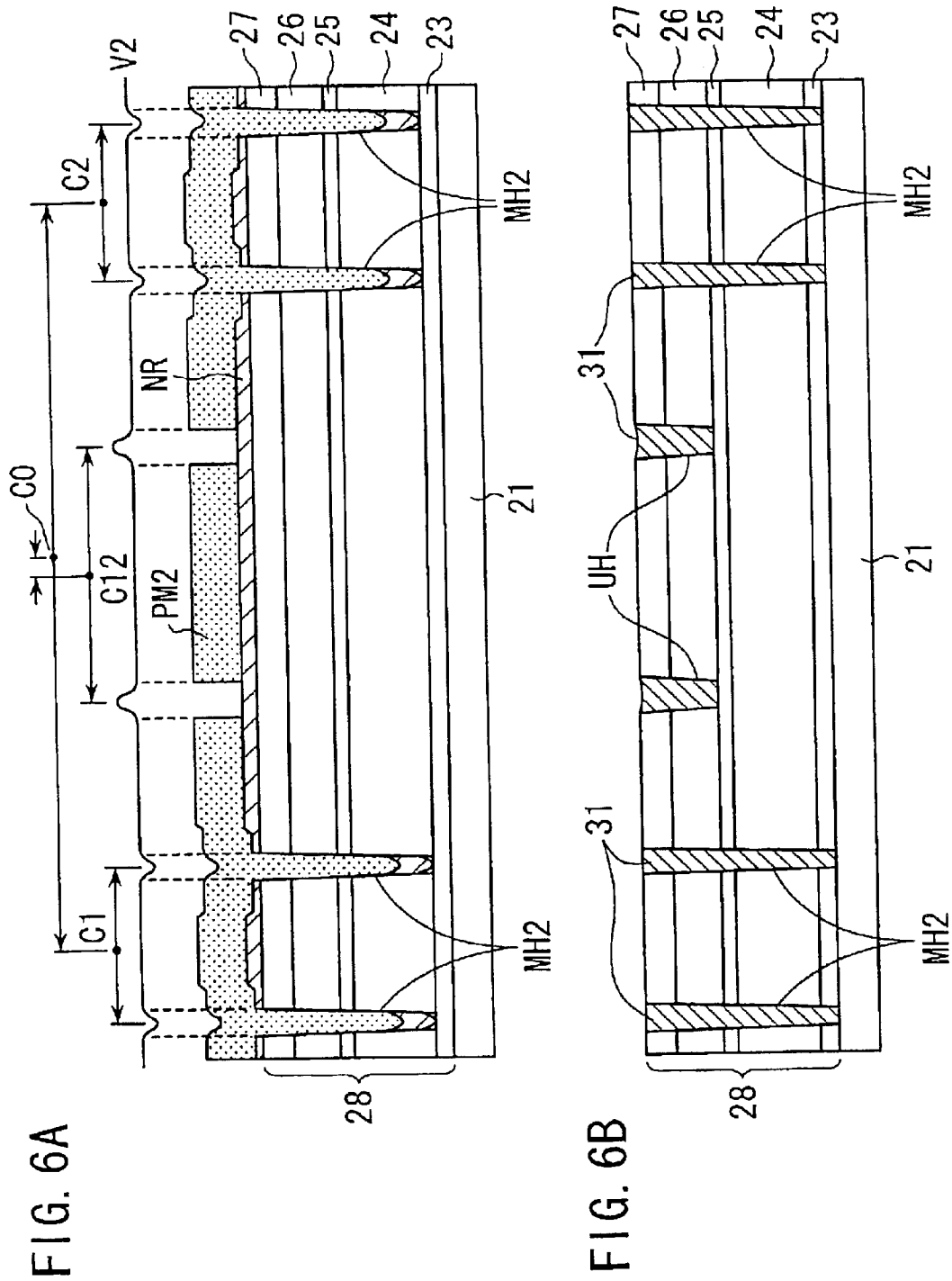
FIG. 6A is an enlarged cross sectional view illustrating a process of detecting an alignment between the second via alignment holes MH2 and the upper layer alignment pattern PM2, in the second photolithography process illustrated in FIG. 4A.
FIG. 6B is an enlarged cross sectional view illustrating a condition of the workpiece in which, in the process illustrated in FIGS. 4C and 4D, the alignment portion is fabricated.

FIG. 6A is an enlarged view illustrating a process of detecting an alignment between the second via alignment holes MH2 corresponding to the second via alignment mark M2 and the upper layer alignment pattern PM2 (second photo resist pattern PR2) corresponding to the upper via alignment mark UM, in the second photolithography process shown in FIG. 4A. Here, a waveform V2 shown in the upper portion of FIG. 6A is an output signal obtained when an optical scanning is performed along the line S2 shown in FIG. 2A by using a misalignment measuring equipment. As can be seen from the waveform of the output signal V2, each of the frame like patterns P2 of the second via alignment hole MH2 has a pair of opposing slits (corresponding to the strips SL2 shown in FIG. 2A) each having a relatively narrow width of approximately 0.5 μm. Therefore, it is possible to detect the locations of these slits (strips SL2) and it is possible to detect, with high precision, the central locations or positions C1 and C2 each of which is the central location between the pair of opposing slits (strips SL2). Thus, from these central locations C1 and C2, it is possible to detect the central location C0 of the second via alignment hole M2 with high precision. At the same time, it is also possible to detect the central location C12 of the upper layer alignment pattern PM2 corresponding to the upper layer via alignment mark UM. Therefore, from these information, it is possible to perform an alignment of the upper layer alignment mark UM with respect to the second via alignment hole MH2. Also, in this case, the anti-reflection film NR and the second photo resist film PR2 are applied into the second via alignment holes MH2. However, since each of the second via alignment holes MH2 has a relatively narrow width, a large quantity of material of the anti-reflection film NR does not flow into the second via alignment holes MH2. As a result, unevenness does not occur in the surface areas of the interlayer insulating film 28 in the proximity of the second via alignment holes MH2, and also coating spot or unevenness does not occur between such areas and the peripheral areas thereof. Therefore, it is possible to avoid bad influence on the shape of the patterns of the photo resist formed in a process thereafter.

FIG. 6B is an enlarged cross sectional view illustrating a condition of the workpiece in which, in the process shown in FIGS. 4C and 4D, the upper layer alignment holes UH are opened in the interlayer insulating film 28, the upper layer alignment holes UH are filled with the wiring material 31 and the upper surface of the interlayer insulating film 28 is flattened by the CMP process. Here, the upper layer alignment holes UH are formed as pairs of opposing straight line patterns and the width of each of the straight line patterns is approximately 2–3 μm. Thus, an aspect ratio of each straight line patterns of the upper layer alignment holes UH is larger than the aspect ratio of each of the conventional via alignment holes. Therefore, it is not possible that the upper layer alignment holes UH are over-etched beyond the SixCy film 25 and the lower layer insulating film 21 are over-etched. As a result, portions of the interlayer insulating film 28 in areas near the upper layer alignment holes UH are not etched excessively, and undesirable unevenness does not occur between such portions and the peripheral portions thereof. Also, when the upper layer alignment holes UH are filled with the wiring material 31 such as copper and the like and the interlayer insulating film 28 is flattened by the CMP process, concave portions are not produced at the upper surface portions of the upper layer alignment holes UH. Therefore, the surface of the interlayer insulating film 28 becomes flat, and pattern accuracy and the like in a photolithography process thereafter is not deteriorated by the unevenness of the surface like the conventional photo mask. Further, slurry and/or air do not remain in the concave portion.

Figure 7A:
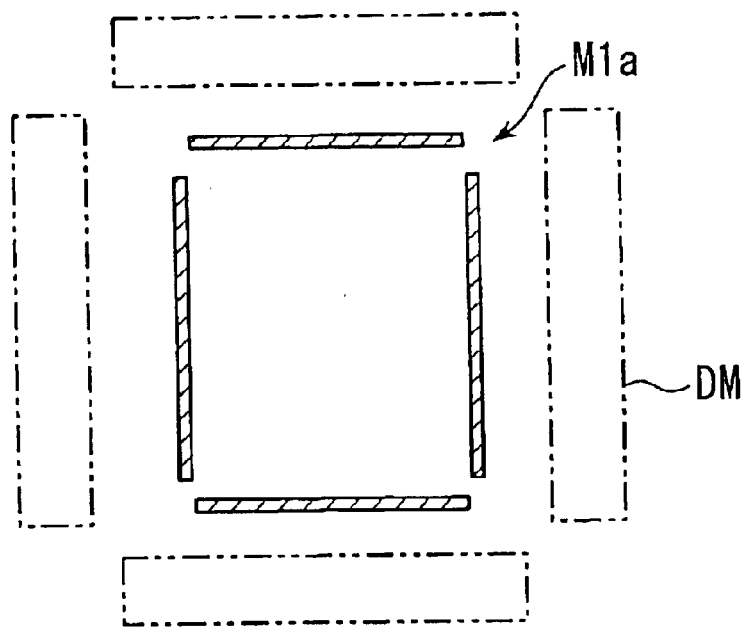
FIG. 7A is a plan view illustrating another example of a pattern shape of the first via alignment mark M1 which is aligned with the lower layer alignment mark DM.
Figure 7B:
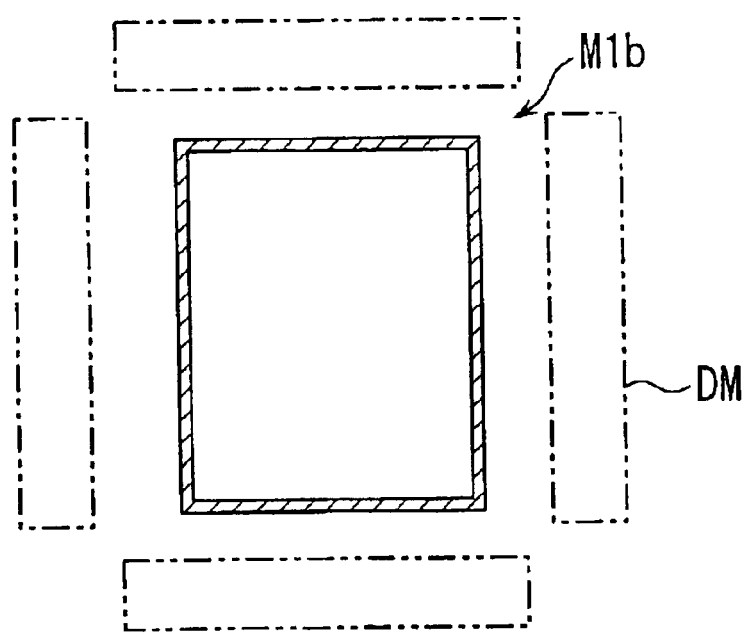
FIG. 7B is a plan view illustrating still another example of a pattern shape of the first via alignment mark M1 which is aligned with the lower layer alignment mark DM.

FIG. 7A and FIG. 7B are plan views illustrating other examples of pattern shapes of the first via alignment mark M1 which is aligned with the lower layer alignment mark DM. FIG. 7A illustrates an example of a first via alignment mark M1a which comprises four thin line patterns each of which has a width of approximately 0.5 μm. Two of the thin line patterns are opposed to each other in X direction and other two of the thin line patterns are opposed to each other in Y direction. FIG. 7B illustrates another example of a first via alignment mark M1b which comprises a square or rectangular shaped frame like continuous thin line pattern. The line width of the frame like pattern is approximately 0.5 μm. Two sides of the frame like pattern are opposed to each other in X direction and other two sides of the frame like pattern are opposed to each other in Y direction.

Figure 8A:
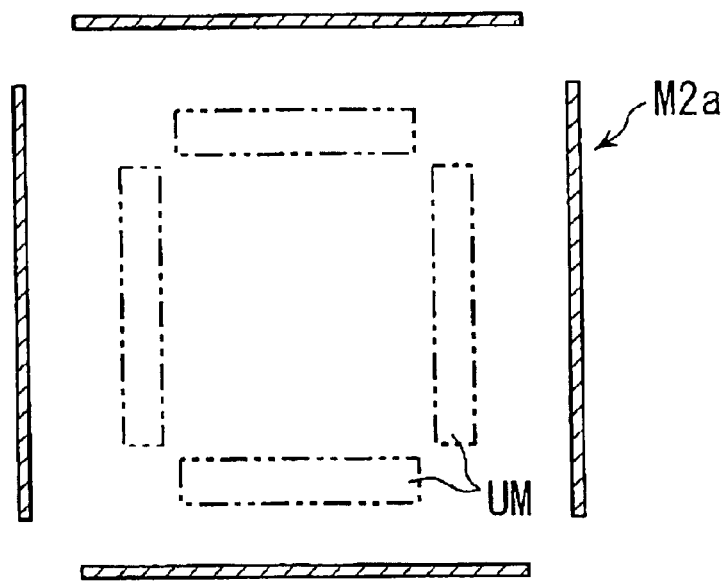
FIG. 8A is a plan view illustrating another example of a pattern shape of the second via alignment mark M2 which is aligned with the upper layer alignment mark UM.
Figure 8B:
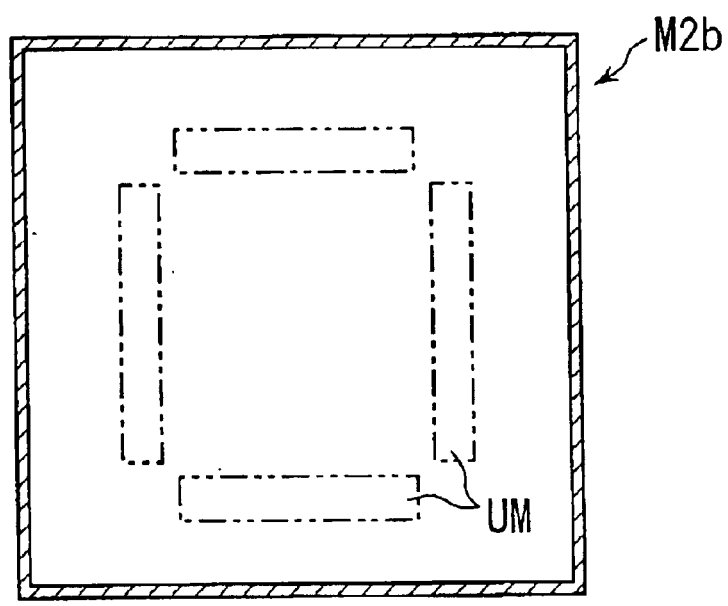
FIG. 8B is a plan view illustrating still another example of a pattern shape of the second via alignment mark M2 which is aligned with the upper layer alignment mark UM.
Figure 9A:
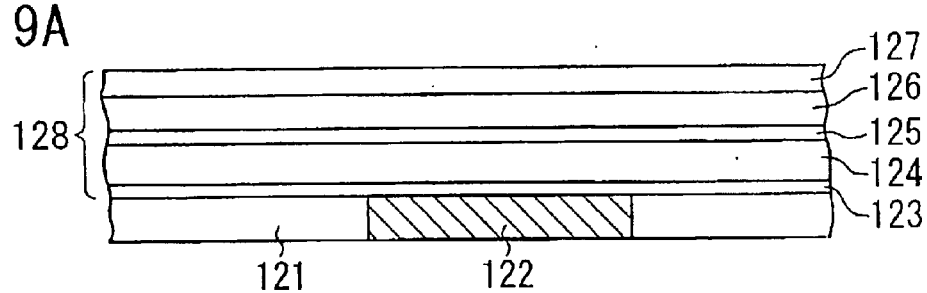
FIGS. 9A–9E are cross sectional views each illustrating a structure of a workpiece obtained during a process of fabricating a dual damascene structure according to a conventional technology.
Figure 9B:
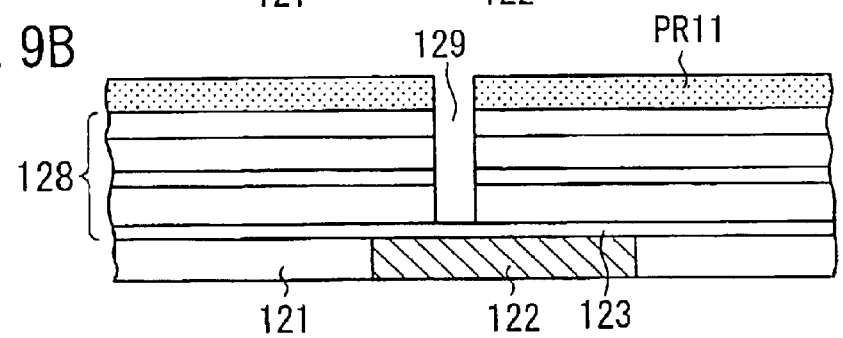
Figure 9C:
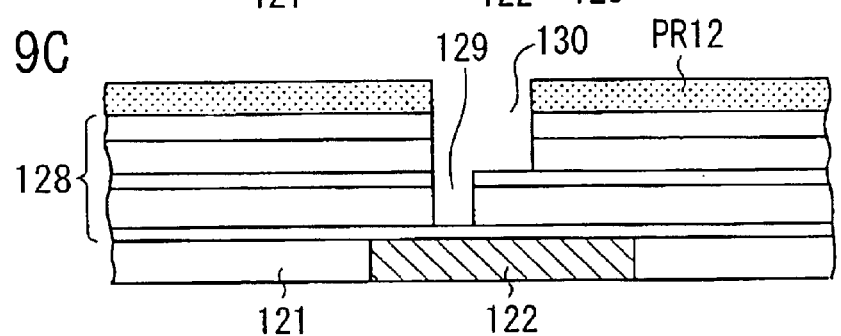
Figure 9D:
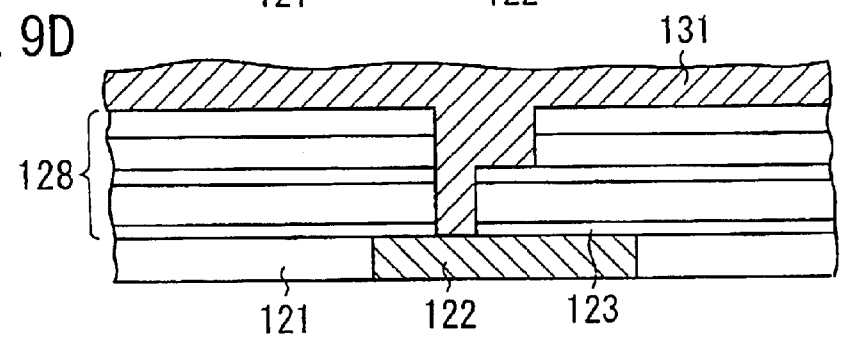
Figure 9E:
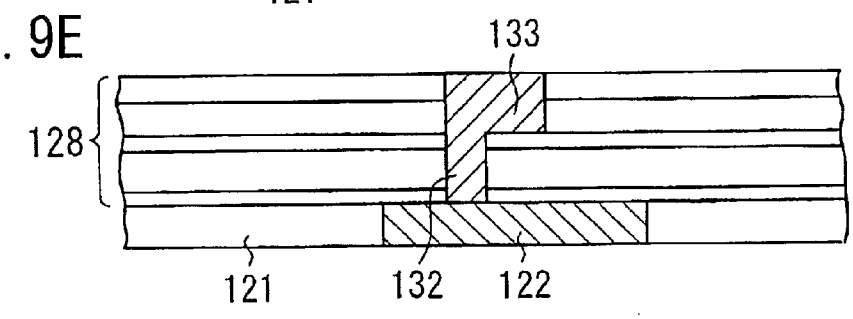
Figure 10A:
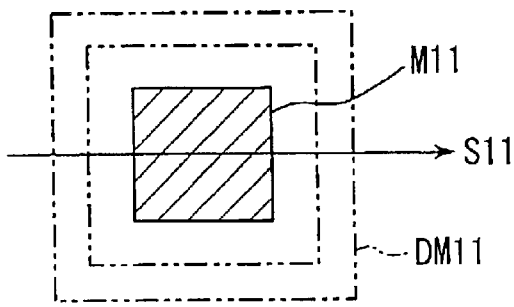
FIG. 10A is a schematic plan view showing an alignment mark used when an alignment is performed in the first photolithography process according to the conventional technology.
Figure 10B:
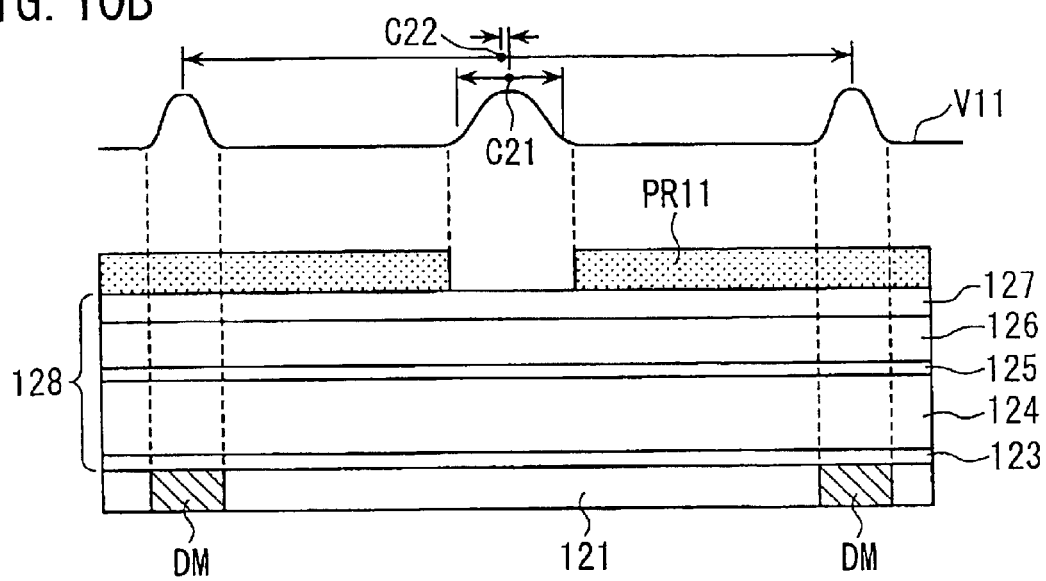
FIG. 10B is a cross sectional view of a workpiece of a semiconductor device formed by using the alignment mark of FIG. 10A.
Figure 10C:
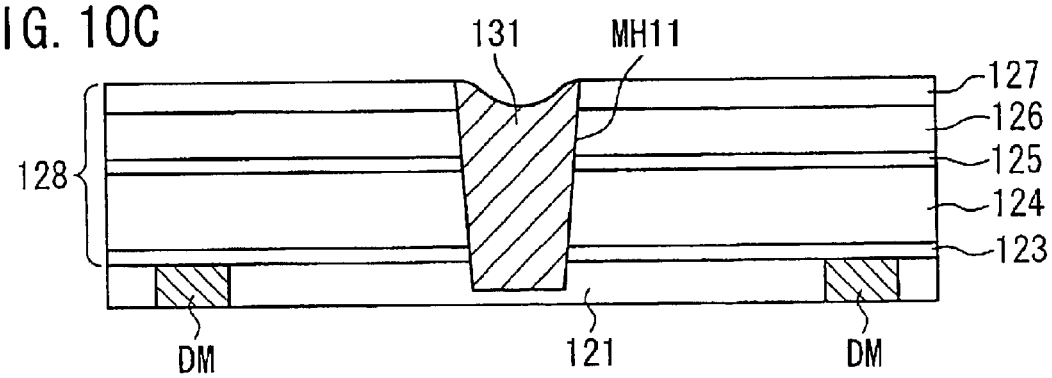
FIG. 10C is a cross sectional view illustrating a via alignment hole formed simultaneously with a via hole in the first photolithography process according to the conventional technology.
Figure 11A:
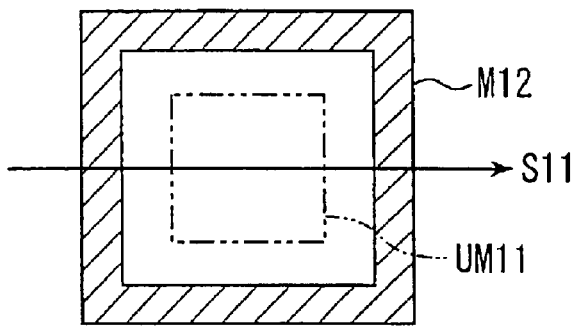
FIG. 11A is a schematic plan view showing an alignment mark used when an alignment is performed in the second photolithography process according to the conventional technology.
Figure 11B:
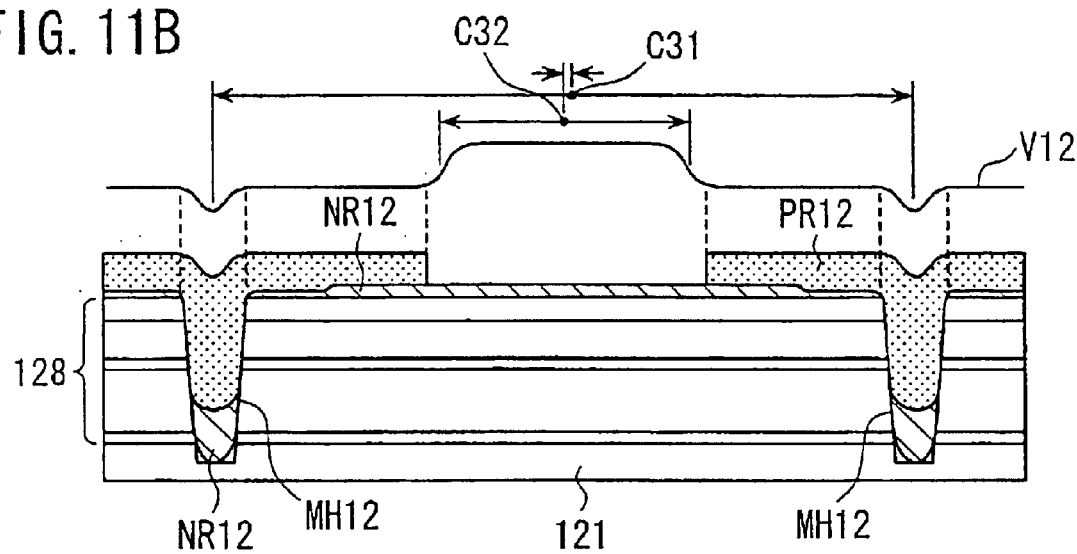
FIG. 11B is a cross sectional view of a workpiece of a semiconductor device formed by using the alignment mark of FIG. 11A.
Figure 11C:
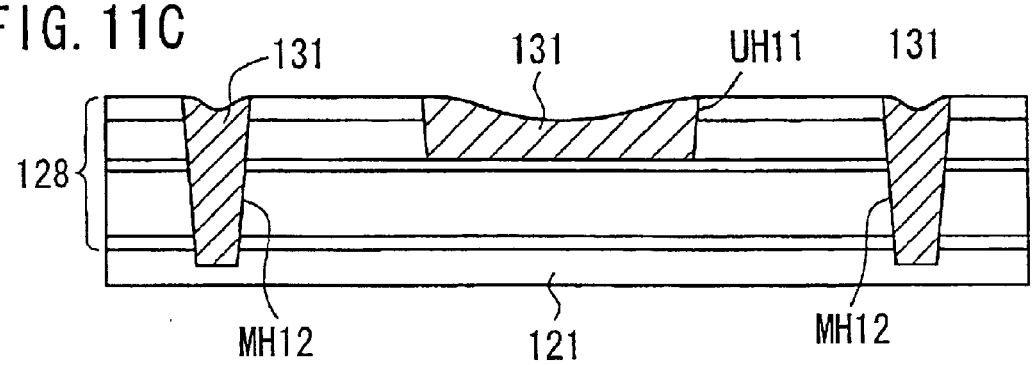
FIG. 11C is a cross sectional view illustrating an upper layer alignment hole formed simultaneously with a wiring groove in the second photolithography process according to the conventional technology.

FIG. 8A and FIG. 8B are plan views illustrating other examples of pattern shapes of the second via alignment mark M2 which is aligned with the upper layer alignment mark UM. FIG. 8A illustrates an example of a second via alignment mark M2a which comprises four thin line patterns each of which has a width of approximately 0.5 μm. Two of the thin line patterns are opposed to each other in X direction and other two of the thin line patterns are opposed to each other in Y direction. FIG. 8B illustrates another example of a second via alignment mark M2b which comprises a square or rectangular shaped frame like continuous thin line pattern. The line width of the frame like pattern is approximately 0.5 μm. Two sides of the frame like pattern are opposed to each other in X direction and other two sides of the frame like pattern are opposed to each other in Y direction.

In any of the above-mentioned alignment marks, it is possible to set an appropriate value on the width of each of the line patterns or strips such that the aspect ratio of the holes opened in the interlayer insulating film 28 becomes as close as possible to the aspect ratio of the proper via holes. Thereby, the advantageous effects of the present invention can be expected as mentioned above.

In the above-mentioned embodiment, an aspect ratio of the via hole with respect to the thickness of the interlayer insulating film was approximately 5.0. On the other hand, the width of each of the strips of the first and second via alignment marks was 0.5 μm, and the aspect ratio of the first and second via alignment marks with respect to the thickness of the interlayer insulating film was approximately 2.0. However, the advantageous effects of the present invention can be attained when the aspect ratio of the via alignment holes has another value. In that case, it is preferable that the aspect ratio of the via alignment holes is equal to or larger than approximately one fourth the aspect ratio of the via hole, that is, 1.25, in the above-mentioned embodiment.

As mentioned above, according to the present invention, each of the alignment marks provided in the photo mask used for opening the via holes and the wiring grooves is constituted of strips (or slits) having a minute width. Therefore, by using, for example, an optical scanning technology, it is possible to detect the central position between the stripes, that is, the central position between the via alignment marks, with high precision, and to perform alignment of the lower layer alignment mark and the upper layer alignment mark with high precision. Also, each of the alignment holes formed by using the via alignment mark has a minute width and has an aspect ratio close to an aspect ratio of proper via holes. Therefore, etching of the alignment holes does not progress more rapidly than etching of the proper via holes, and the lower layer insulating film is not over-etched. Thus, the interlayer insulating film in the areas near the alignment holes is not etched excessively, and undesirable unevenness of the upper surface of the interlayer insulating film 28 does not occur in such areas with respect to the peripheral area thereof. Further, when the alignment holes are filled with wiring material such as copper and the like and the interlayer insulating film is flattened by the CMP process, concave portions are not produced at the upper surface portions of the alignment holes. Therefore, the surface of the interlayer insulating film becomes flat, and pattern accuracy and the like in a photolithography process thereafter is not deteriorated by the unevenness of the surface of the workpiece. Further, slurry and/or air do not remain in the concave portion. As a result, it becomes possible to fabricate semiconductor devices having high reliability.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as falling within the scope of the appended claims.

What is claimed is:

1. A photo mask for fabricating a semiconductor device having a dual damascene structure which has a via coupled with a lower wiring layer and has an upper wiring layer coupled with the via, the via and the upper wiring layer being fabricated by filling a via hole and a wiring groove formed in an interlayer insulating film that is formed on the lower wiring layer with a wiring material, the photo mask having:
    a via alignment mark which is used for aligning the via hole with respect to the lower wiring layer;
    wherein the width of the via alignment mark is equal to or larger than the width which is optically detectable and an aspect ratio of the via alignment mark is equal to or larger than one fourth of the aspect ratio of the via hole.

2. A photo mask as set forth in claim 1, wherein the via alignment mark comprises two sets of straight line shaped strips, one set of the straight line shaped strips having at least a pair of straight line shaped patterns which are opposed to each other in X direction in a plane and the other set of the straight line shaped strips having at least a pair of straight line shaped patterns which are opposed to each other in Y direction in the same plane.

3. A photo mask as set forth in claim 2, wherein the two sets of straight line shaped strips are disposed parallel to a lower layer alignment mark which is formed simultaneously with the lower wiring layer.

4. A photo mask as set forth in claim 2, wherein one set of the straight line shaped strips comprises a pair of frame like patterns each of which has an elongated rectangular frame shape and which are opposed to each other in X direction and the other set of the straight line shaped strips comprises a pair of frame like patterns each of which has an elongated rectangular frame shape and which are opposed to each other in Y direction, such that the four frame like patterns constitute a square or a rectangular shape.

5. A photo mask as set forth in claim 2, wherein the via alignment mark comprises a frame like square or rectangular shaped strip.

6. A photo mask for fabricating a semiconductor device having a dual damascene structure which has a via coupled with a lower wiring layer and has an upper wiring layer coupled with the via, the via and the upper wiring layer being fabricated by filling a via hole and a wiring groove formed in an interlayer insulating film that is formed on the lower wiring layer with a wiring material, the photo mask having:
    a via alignment mark which is used for aligning the wiring groove with respect to the via hole;
    wherein the width of the via alignment mark is equal to or larger than the width which is optically detectable and an aspect ratio of the via alignment mark is equal to or larger than one fourth of the aspect ratio of the via hole.

7. A photo mask as set forth in claim 6, wherein the via alignment mark comprises two sets of straight line shaped strips, one set of the straight line shaped strips having at least a pair of straight line shaped patterns which are opposed to each other in X direction in a plane and the other set of the straight line shaped strips having at least a pair of straight line shaped patterns which are opposed to each other in Y direction in the same plane.

8. A photo mask as set forth in claim 7, wherein the two sets of straight line shaped strips are disposed parallel to an upper layer alignment mark which is formed simultaneously with the upper wiring layer.

9. A photo mask as set forth in claim 7, wherein one set of the straight line shaped strips comprises a pair of frame like patterns each of which has an elongated rectangular frame shape and which are opposed to each other in X direction and the other set of the straight line shaped strips comprises a pair of frame like patterns each of which has an elongated rectangular frame shape and which are opposed to each other in Y direction, such that the four frame like patterns constitute a square or a rectangular shape.

10. A photo mask as set forth in claim 7, wherein the via alignment mark comprises a frame like square or rectangular shaped strip.

11. A method of manufacturing a semiconductor device having a dual damascene structure, the method comprising:
    forming a via hole in an interlayer insulating film formed on a lower wiring layer;
    forming a wiring groove in the interlayer insulating film which includes the via hole;
    filling the via hole and the wiring groove with a wiring material;
    flattening the surface of the wiring material together with the surface of the interlayer insulating film such that the wiring material remains in the via hole and the wiring groove, thereby forming a via and an upper wiring layer;
    wherein, in forming the via hole in the interlayer insulating film formed on the lower wiring layer, the via hole is formed by a photolithography process that uses a photo mask having a via alignment mark which is used for aligning the via hole with respect to the lower wiring layer; and
    wherein the width of the via alignment mark is equal to or larger than the width which is optically detectable and an aspect ratio of the via alignment mark is equal to or larger than one fourth of the aspect ratio of the via hole.

12. A method of manufacturing a semiconductor device as set forth in claim 11, wherein the via alignment mark comprises two sets of straight line shaped strips, one set of the straight line shaped strips having at least a pair of straight line shaped patterns which are opposed to each other in X direction in a plane and the other set of the straight line shaped strips having at least a pair of straight line shaped patterns which are opposed to each other in Y direction in the same plane.

13. A method of manufacturing a semiconductor device as set forth in claim 12, wherein the two sets of straight line shaped strips are disposed parallel to a lower layer alignment mark which is formed simultaneously with the lower wiring layer.

14. A method of manufacturing a semiconductor device as set forth in claim 12, wherein one set of the straight line shaped strips comprises a pair of frame like patterns each of which has an elongated rectangular frame shape and which are opposed to each other in X direction and the other set of the straight line shaped strips comprises a pair of frame like patterns each of which has an elongated rectangular frame shape and which are opposed to each other in Y direction, such that the four frame like patterns constitute a square or a rectangular shape.

15. A method of manufacturing a semiconductor device as set forth in claim 12, wherein the via alignment mark comprises a frame like square or rectangular shaped strip.

16. A method of manufacturing a semiconductor device having a dual damascene structure, the method comprising:
   forming a via hole in an interlayer insulating film formed on a lower wiring layer;
   forming a wiring groove in the interlayer insulating film which includes the via hole;
   filling the via hole and the wiring groove with a wiring material;
   flattening the surface of the wiring material together with the surface of the interlayer insulating film such that the wiring material remains in the via hole and the wiring groove, thereby forming a via and an upper wiring layer;
   wherein, when forming the wiring groove in an interlayer insulating film which includes the via hole, the wiring groove is formed by a photolithography process that uses a photo mask having a via alignment mark which is used for aligning the wiring groove with respect to the via hole;
   wherein the width of the via alignment mark is equal to or larger than the width which is optically detectable and an aspect ratio of the via alignment mark is equal to or larger than one fourth of the aspect ratio of the via hole.

17. A method of manufacturing a semiconductor device as set forth in claim 16, wherein the via alignment mark comprises two sets of straight line shaped strips, one set of the straight line shaped strips having at least a pair of straight line shaped patterns which are opposed to each other in X direction in a plane and the other set of the straight line shaped strips having at least a pair of straight line shaped patterns which are opposed to each other in Y direction in the same plane.

18. A method of manufacturing a semiconductor device as set forth in claim 17, wherein the two sets of straight line shaped strips are disposed parallel to an upper layer alignment mark which is formed simultaneously with the upper wiring layer.

19. A method of manufacturing a semiconductor device as set forth in claim 17, wherein one set of the straight line shaped strips comprises a pair of frame like patterns each of which has an elongated rectangular frame shape and which are opposed to each other in X direction and the other set of the straight line shaped strips comprises a pair of frame like patterns each of which has an elongated rectangular frame shape and which are opposed to each other in Y direction, such that the four frame like patterns constitute a square or a rectangular shape.

20. A method of manufacturing a semiconductor device as set forth in claim 17, wherein the via alignment mark comprises a frame like square or rectangular shaped strip.

\* \* \* \* \*